(12) United States Patent
Chen et al.

(10) Patent No.: US 12,374,615 B2
(45) Date of Patent: Jul. 29, 2025

(54) ELECTRONIC DEVICES WITH A LOW DIELECTRIC CONSTANT

(71) Applicant: International Business Machines Corporation, Armonk, NY (US)

(72) Inventors: Hsueh-Chung Chen, Cohoes, NY (US); Su Chen Fan, Cohoes, NY (US); Dechao Guo, Niskayuna, NY (US); Carl Radens, LaGrangeville, NY (US); Indira Seshadri, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 706 days.

(21) Appl. No.: 17/645,402

(22) Filed: Dec. 21, 2021

(65) Prior Publication Data

US 2023/0197603 A1   Jun. 22, 2023

(51) Int. Cl.
*H01L 23/522* (2006.01)
*H01L 21/768* (2006.01)
*H01L 23/528* (2006.01)
*H01L 23/532* (2006.01)

(52) U.S. Cl.
CPC ...... *H01L 23/5226* (2013.01); *H01L 21/7682* (2013.01); *H01L 21/76849* (2013.01); *H01L 21/76877* (2013.01); *H01L 23/5283* (2013.01); *H01L 23/5329* (2013.01)

(58) Field of Classification Search
CPC ............ H01L 23/5226; H01L 21/7682; H01L 21/76849; H01L 21/76877; H01L 23/5283; H01L 23/5329; H01L 21/76804; H01L 23/528; H01L 21/76885
See application file for complete search history.

(56) References Cited

U.S. PATENT DOCUMENTS

| | | | |
|---|---|---|---|
| 7,928,003 B2 | 4/2011 | Naik | |
| 8,114,769 B1 | 2/2012 | Srivastava et al. | |
| 8,754,526 B2 | 6/2014 | Yang et al. | |
| 9,349,687 B1 | 5/2016 | Gates et al. | |
| 9,425,049 B2 | 8/2016 | Huang et al. | |

(Continued)

FOREIGN PATENT DOCUMENTS

TW           200411823 B1     7/2004

OTHER PUBLICATIONS

K. Cheng et al., "Air spacer for 10nm FinFET CMOS and beyond," 2016 IEEE International Electron Devices Meeting (IEDM), 2016, pp. 17.1.1-17.1.4, doi: 10.1109/IEDM.2016.7838436. [Abstract Only].

(Continued)

*Primary Examiner* — Karen Kusumakar
(74) *Attorney, Agent, or Firm* — Patterson + Sheridan, LLP

(57) ABSTRACT

An interconnect layer for a device and methods for fabricating the interconnect layer are provided. The interconnect layer includes first metal structures arranged in a first array in the interconnect layer and second metal structures, arranged in a second array in the interconnect layer. The second array includes at least one metal structure positioned between two metal structures of the first metal structures. The interconnect layer also includes a spacer material formed around each of the first metal structures and the second metal structures and air gaps formed in the spacer material on each side of the first metal structures.

20 Claims, 16 Drawing Sheets

(56) References Cited

U.S. PATENT DOCUMENTS

| | | |
|---|---|---|
| 9,490,163 B2 | 11/2016 | Huang et al. |
| 9,607,882 B2 | 3/2017 | Lin |
| 9,646,881 B2 | 5/2017 | Bruce et al. |
| 9,691,850 B2 | 6/2017 | Cheng et al. |
| 9,716,158 B1 | 7/2017 | Cheng et al. |
| 9,786,597 B2 | 10/2017 | Chang et al. |
| 10,020,254 B1 | 7/2018 | Bao et al. |
| 10,199,264 B2 | 2/2019 | Zhang et al. |
| 10,553,532 B2 | 2/2020 | Schenker et al. |
| 10,818,494 B2 | 10/2020 | Chen et al. |
| 10,879,179 B2 | 12/2020 | Wu et al. |
| 10,892,223 B2 | 1/2021 | Schenker et al. |
| 11,081,445 B2 | 8/2021 | Wu et al. |
| 2007/0134917 A1 | 6/2007 | Li et al. |
| 2014/0077161 A1* | 3/2014 | Duan .................. H10D 30/47 257/29 |
| 2020/0411415 A1* | 12/2020 | Wu .................. H01L 21/76832 |
| 2020/0411427 A1 | 12/2020 | Lin et al. |
| 2023/0068892 A1* | 3/2023 | Huang .............. H01L 21/76885 |

OTHER PUBLICATIONS

Paolillo et al, "Direct Metal Etch of Ruthenium for Advanced Interconnect," Journal of Vacuum Science & Technology B 36, 03E103 (2018), Dated May 2, 2018, pp. 1-4 [Abstract Only].

\* cited by examiner

ELECTRONIC DEVICES WITH A LOW DIELECTRIC CONSTANT

BACKGROUND

The present invention relates to interconnection layers in integrated circuits/semiconductor devices, and more specifically, to providing very low dielectric constant (low-k) insulation between interconnections in semiconductor devices.

As semiconductor devices decrease in size and increase in the density and number of interconnects, the importance of insulating the various interconnects and other conducting elements in the devices increases. Providing low-k insulation between interconnects addresses the insulation demands of these devices.

SUMMARY

According to one embodiment of the present invention, an example embodiment includes an interconnect layer for a device. The interconnect layer includes a plurality of first metal structures arranged in a first array in the interconnect layer; a plurality of second metal structures, arranged in a second array in the interconnect layer, where the second array may include at least one metal structure of the plurality of second metal structures positioned between two metal structures of the plurality of first metal structures, where the plurality of second metal structures may include a different composition from the plurality of first metal structures. The interconnect layer also includes a spacer material formed around each of the plurality of first metal structures and the plurality of second metal structures, and a plurality of air gaps formed in the spacer material on each side of the plurality of first metal structures.

One example embodiment includes a device. The device also includes a substrate layer, a first layer, formed on the substrate layer. The first layer may include one or more metal contacts. The device may include an interconnect layer formed on the first layer. The interconnect layer may include a plurality of first metal structures arranged in a first array in the interconnect layer, a plurality of second metal structures, arranged in a second array in the interconnect layer, where the second array may include at least one metal structure of the plurality of second metal structures positioned between two metal structures of the plurality of first metal structures. The plurality of second metal structures may also include a different composition from the plurality of first metal structures. The device also include a spacer material formed around each of the plurality of first metal structures and the plurality of second metal structures, and a plurality of air gaps formed in the spacer material on each side of the plurality of first metal structures.

One general aspect includes a method of fabrication. The method includes forming a first array of metal structures on a base structure, depositing a first spacer material on the base structure and the first array of metal structures, and etching the first space material to form an array of structured spaces in the spacer material. The method also includes forming a second array of metal structures using the array of structured spaces, removing the first spacer material, forming a spacer layer with a plurality of air gaps between the first array of metal structures and the second array of metal structures, and processing the first array of metal structures, the second array of metal structures, and the spacer layer to form an interconnect layer for a device. Other embodiments of this aspect include corresponding computer systems, apparatus, and computer programs recorded on one or more computer storage devices, each configured to perform the actions of the method.

DETAILED DESCRIPTION

Interconnect layers, including middle-of-line (MOL) layers, of microelectronic and other semiconductor devices are increasingly more complex, decreasing in size, and include increasing density of interconnects. In order to address challenges that come from resistance-capacitance (RC) delay, power/signal dissipation, noise, etc. in the interconnect layers, low-k materials are formed/positioned between the interconnect structures in the interconnect layers. While various materials have been developed to provide a low dielectric constant (low-k) insulation between interconnects, the use of air gaps in the materials provides even lower k properties. While some previous fabrication methods and interconnect structures provide air gaps between interconnect structures, the types of materials used and the shape of the interconnect structures have been limited due to fabrication restraints.

The methods, device, and interconnect layers described herein provide a low-k interconnect layer formed via litho-etch-litho-etch (LELE) processes that allows for multiple varying materials and shapes to be used in the interconnect structures while also providing low-k materials in spacers with air gaps formed between the interconnect structures.

Figure 1A:
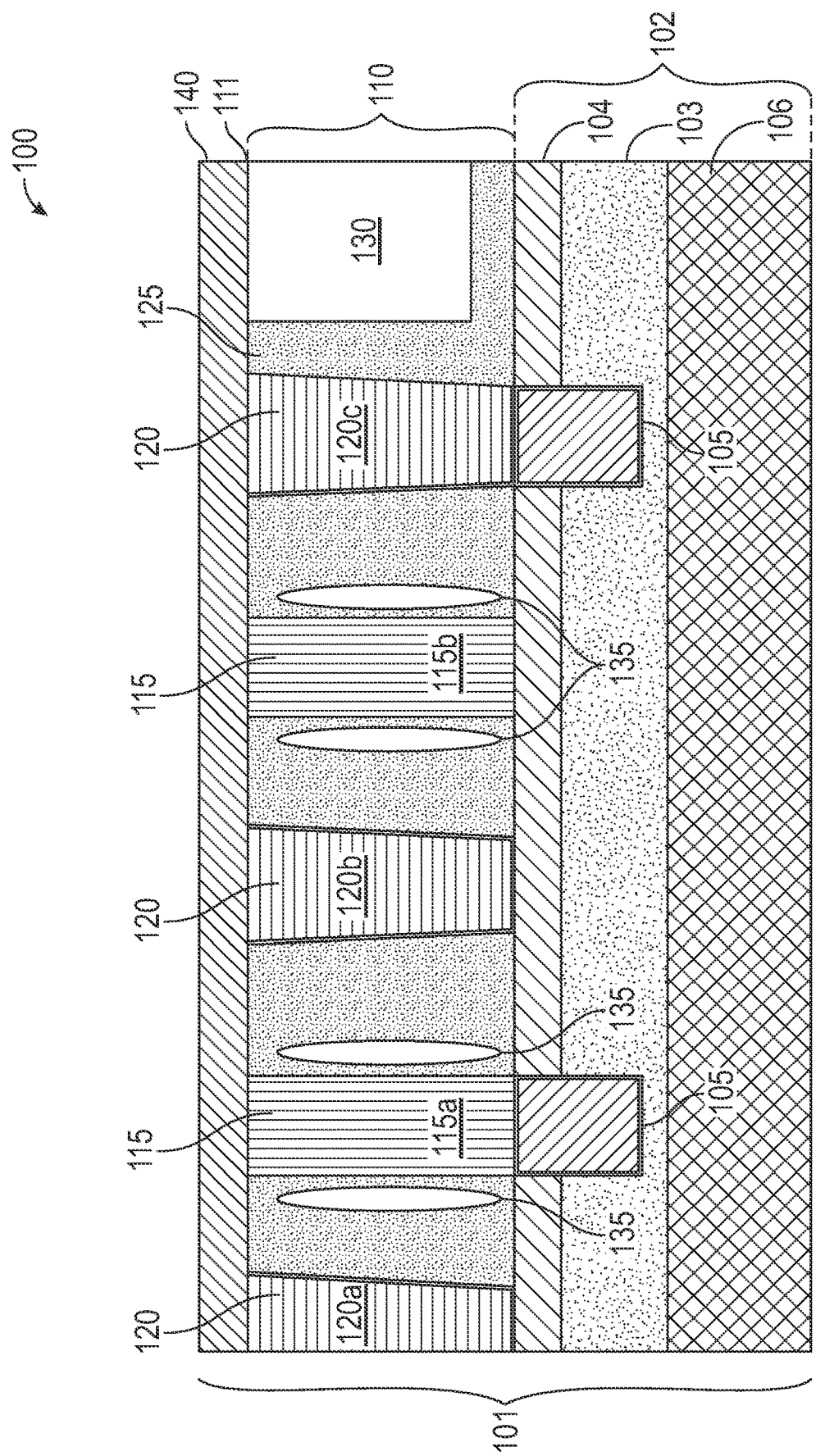
FIGS. 1A-D illustrates a device with a low-k interconnect layer, according to embodiments of the present disclosure.

FIGS. 1A-D illustrate various views of a device 101 with a low-k interconnect layer 110, according to embodiments of the present disclosure. FIG. 1A illustrates a cross-section view 100 of the device 101. The device 101 may include any type of microelectronic or semiconductor devices, including an integrated circuit (IC) device, etc., where the device 101 includes an interconnect layer, such as an interconnect layer 110. While described herein as a MOL device/layer providing local interconnects, the interconnect layer 110 may be any type of interconnect layer in a semiconductor device, such as back-end-of-line (BEOL) interconnect layer providing global interconnects.

The device 101 includes lower layers 102 of the device. The interconnect layer 110 provides electrical/signal connections (e.g., through interconnects interconnect structures) from the lower layers 102 to a top side 111 of the interconnect layer. In some examples, additional layers, such as additional device or other layers (not shown in FIG. 1A), are formed on the top of the interconnect layer 110. In some examples, the lower layers 102 include a substrate layer 106 and a first layer 103. The first layer 103 may include an interlayer dielectrics (ILD) material layer with embedded metal contacts, such as metal contacts 105, formed in the ILD material. The device 101 may also include a first etch stop layer 104 (base etch stop layer) as well as the metal contacts 105 extending through the first etch stop layer 104.

In some examples, the first etch stop layer 104 provides a fabrication base for the interconnect layer 110 to be formed as described in relation to FIGS. 3-5I. Additionally, the device 101 includes a cap etch stop layer 140 formed on the top side 111. In some examples, the k value (i.e., the dielectric constant value) of the first etch stop layer 104 and the cap etch stop layer 140 is ~4.5. Removing the first etch stop layer 104 as well as the cap etch stop layer 140 from the interconnect layer 110 allows for lower k materials and additional air gaps to be utilized between interconnects in the interconnect layer 110, and providing better insulation between interconnects in the interconnect layer.

In some examples, the interconnect layer 110 includes a plurality of interconnects including a plurality of first metal structures in a first array 115. For ease of description the number of interconnects depicted in the cross-section view 100 is limited; however, the number of interconnects and relative positions of each respective interconnect is not limited to the examples shown in FIGS. 1A-1D. In some examples, the plurality of first metal structures include structures 115a and 115b in the first array 115 as shown in the cross-section view 100. In some examples, the structures in the first array 115 may include metal lines, confined metal structures, or other types of interconnect structure.

Additionally, the various structures in the first array 115 may include associated spacer materials formed on each vertical side or sidewall of the structure. For example, as these features are shown in cross-section 150 in FIG. 1B, which is a subsection of the cross-section view 100 of FIG. 1A. For example, the structure 115a includes spacer material 125 on each sidewall of the structure 115a, including sidewall 151 and sidewall 152. In some examples, the spacer material 125 includes air gaps 135a and 135b positioned adjacent to the sidewalls of the structure 115a. For example, the air gap 135a is adjacent to the sidewall 151 and the air gap 135b is adjacent to the sidewall 152. The air gaps and the spacer material 125 provide very low-k insulation to the structure 115a to reduce the interference from the structure 115a to other interconnects in the interconnect layer 110 as well as shield the structure 115a from interference caused by other interconnects in the interconnect layer 110.

Figure 1B:
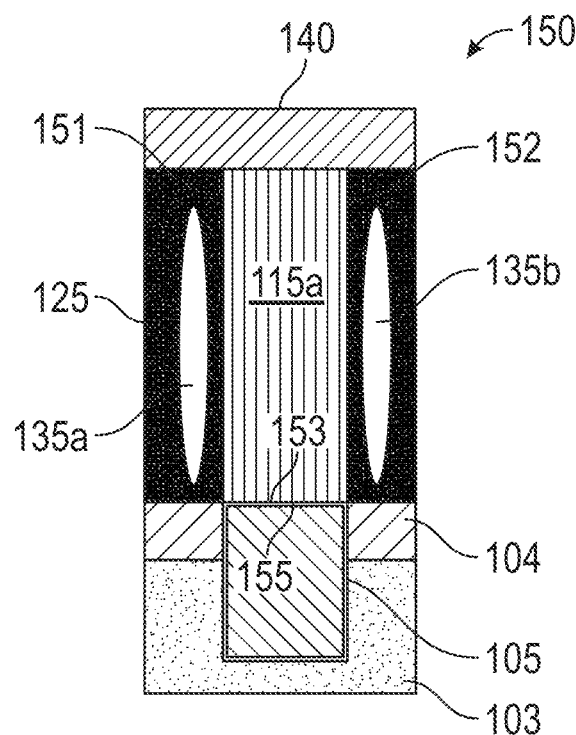
Figure 2:
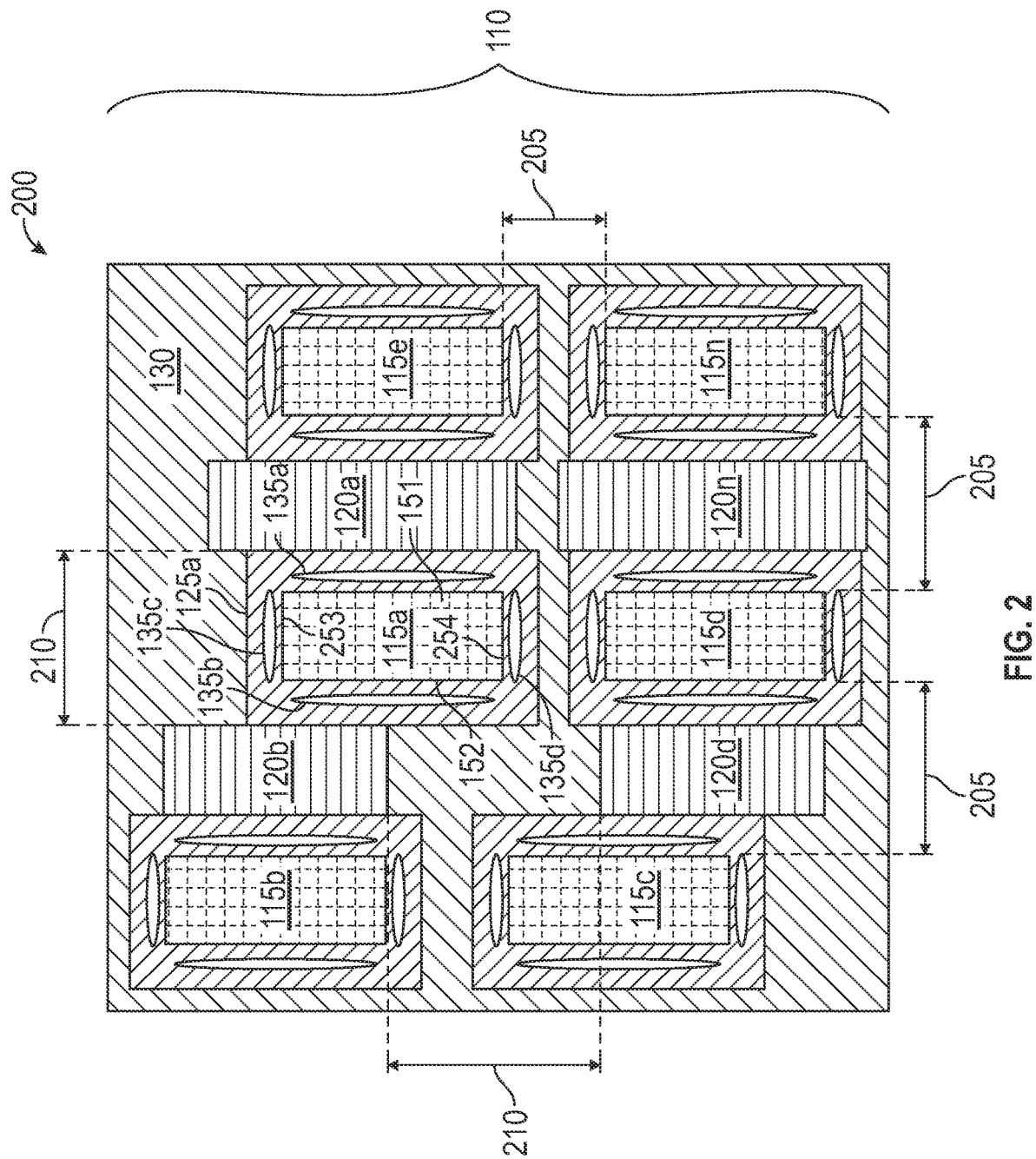
FIG. 2 is a top view of a low-k interconnect layer, according to embodiments of the present disclosure.

While not shown in cross-section 150, the spacer material 125 may include additional air gaps on additional sidewalls of the structure 115a (as described in more detail in relation to FIG. 2). In some examples, the structure 115a is positioned over a metal contact in the lower layers 102, such as the metal contacts 105 shown in FIG. 1B. The structure 115a may also include a first liner layer 155, formed on a side 153 (e.g., a bottom side) of the structure 115a.

Returning back to FIG. 1A, the interconnect layer 110 may also include a plurality of second metal structures in a second array 120. In some examples, the plurality of second metal structures may include a different shape and a different material than the structures in the first array 115. In some examples, the plurality of second material structures include structures 120a (depicted in a partial view in cross-section 100), 120b, and 120c, in the second array 120. The various structures in the second array 120 may include a varying cross-sectional shape and spacer materials formed on each sidewall of the structure.

Figure 1C:
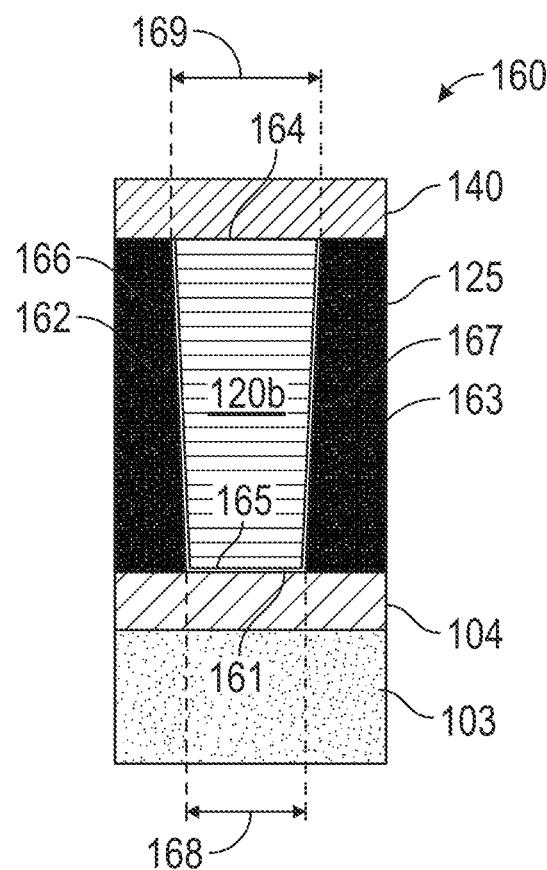

For example, as shown in cross-section 160 in FIG. 1C, which is a subsection of the cross-section view 100 of FIG. 1A, the structure 120b is a trapezoidal structure with a trapezoidal cross-sectional shape. For example, a side 161 (bottom side) of the structure 120b has a first length 168 and a side 164 (top side) of the structure 120b has a second length 169. In some examples, the first length 168 is shorter than the second length 169 (i.e., the second length 169 is longer than the first length 168). In some examples, the cross-sectional shape of the structures in the second array 120 may differ from cross-sectional shape of the structures in the first array 115. For example, as shown in FIGS. 1A-B, the structures in the first array 115 may include a rectangular cross-sectional shape. In another example, the structures in the first array 115 may include an inversed trapezoidal shape relative to the structures in second array 120 (e.g., a length of the top side of the structures in the first array 115 are shorter than a length of the bottom side of the structures in the first array 115.)

In some examples, the structure 120b includes spacer material 125 formed on each sidewall of the structure 120b. For example, the spacer material 125 is formed on a sidewall 162 and a sidewall 163. In some examples, each respective metal structure in the second array 120 may include associated liner layer(s). For example, the structure 120b includes liner layers between the material of the structure and the spacer material 125 or the lower layers 102. For example, a liner layer 165 is formed on the side 161 (e.g., bottom side) of the structure 120b. The structure 120b may also include a liner layer 166 (second liner layer) on the sidewall 162 and a liner layer 167 (third liner layer) on a sidewall 163 of the structure 120b. In some examples, the liner layers 162-163 and the spacer material 125 provide very low-k insulation to the structure 120b to reduce the interference from the structure 120b to other interconnects in the interconnect layer 110 as well as shield the structure 120b from interference caused by other interconnects in the interconnect layer 110. In some examples, not every sidewall in a structure of the second array 120 requires a liner layer as shown in relation to FIG. 1D.

Figure 1D:
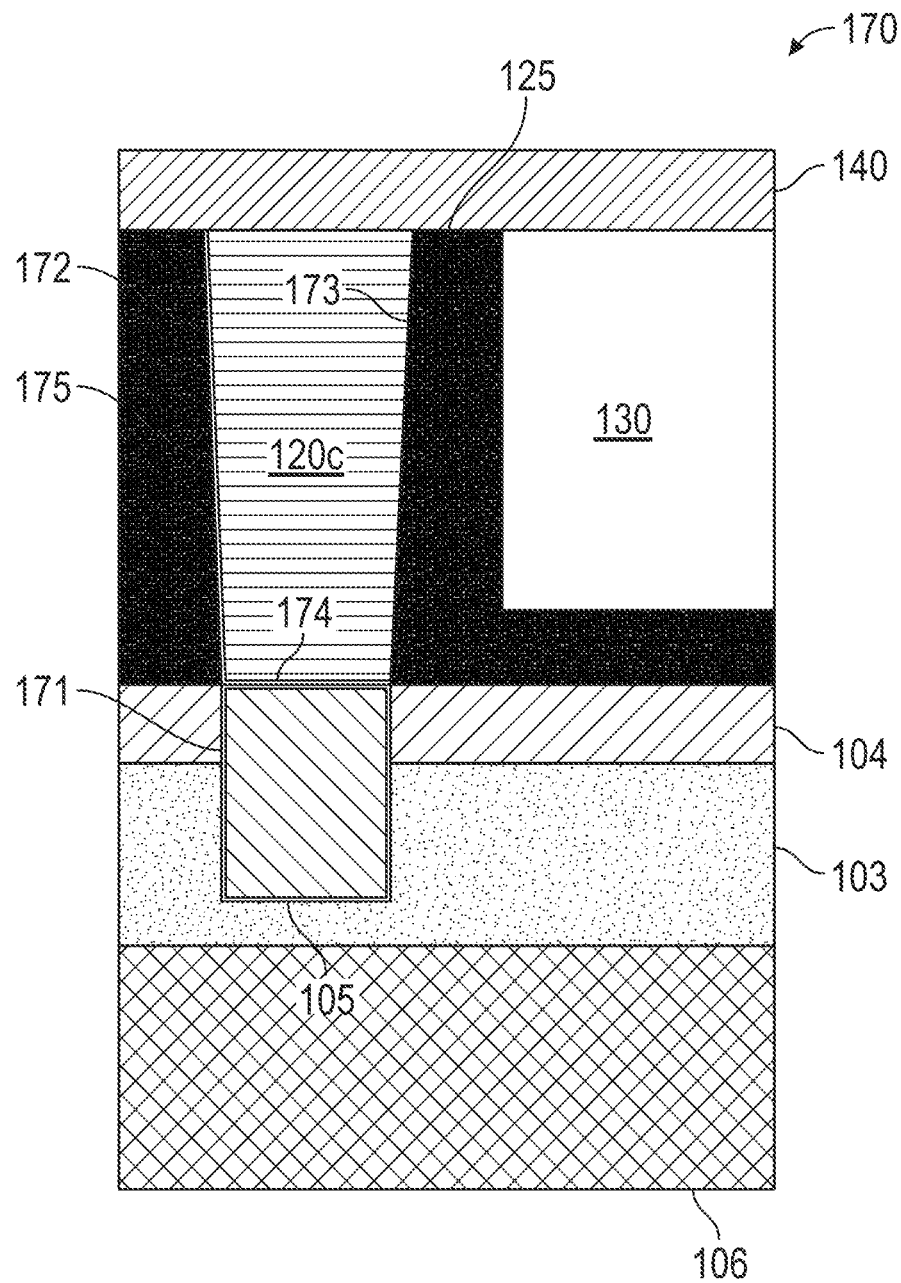

FIG. 1D depicts cross-section view 170, which is a subsection of the cross-section view 100 of FIG. 1A, where the structure 120c includes only two liner layers on a sidewall 172 and a side 171 (bottom side). For example, a liner layer 174 is formed on side 171 and a liner layer 175 is formed on the sidewall 172. A sidewall 173 of the structure 120c is not positioned adjacent to another interconnect structure (e.g., not adjacent to a structure in the first array 115 or the second array 120). Instead, the sidewall 173 is adjacent to material section 130. The interconnect layer 110 may also include additional sections such as material section 130 of low-k material such as Octamethylcyclotetrasiloxane (OMCTS) or other low-k dielectric material (e.g., a material with a k value between 2.7-2.2) which fills any spaces in the interconnect layer not filled by the first array 115, the second array 120, or the spacer material 125 (including air gaps in the spacer material 125). The material section 130 is described in more detail in relation to FIG. 2.

Returning back to FIG. 1A, the device 101 may also include a second etch stop layer 140 formed on the top side 111 of the interconnect layer 110 to provide a base for additional layers or other interconnects to be formed on top of the interconnect layer 110 and the device 101. In some examples, the first array 115 and the second array 120 are both positioned in the interconnect layer 110 in spaced apart relationships where a structure in the first array 115 is positioned in the interconnect layer 110 spaced apart from another structure in the first array 115 (e.g., structure 115a is spaced away from the structure 115b). Similarly, the structures 120b and 120c are spaced apart from each other in the second array 120. Additional views of the first array 115, the second array 120, and the spacer material 125 is shown in FIG. 2.

FIG. 2 is a top view 200 of the interconnect layer 110 described in relation to FIGS. 1A-D. In some examples, the top view 200 includes a portion of the interconnect layer 110, including a top view of structures 115a, 115b, 120a, and 120c, among others. The structures in the first array 115 described in FIG. 1A, are spaced apart from the other structures in the first array. For example, the structures 115c and 115d are separated by a distance 205. The structures 115d and 115 are also separated by the distance 205.

The structures of the second array 120 are also separated by a distance. For example, the structures 120b and 120a are separated by a distance 210. While shown standard distances for ease of illustration in FIG. 2, the distances 205 and 210 may vary between each structures in their respective arrays. In some examples, at least one structure of the second array 120 is positioned between structures of the first array 115. For example, the structure 120b is positioned between the structures 115b and 115a. In the top view 200, each of the structures 120a-120n is positioned between structures of the first array 115, however, some of the structures of the second array 120, (e.g., the structure 120c shown in FIGS. 1A and 1D, are positioned such that a structure of the first array is adjacent on only one side of the structure in the second array 120).

Furthermore, as described in relation to FIGS. 1A-1B, the structures 115a-115n of the first array 115 include spacer material 125 on each side of the respective structures. For example, the structure 115a includes the spacer material 125a formed on each side of the structure 115a. In some examples, the spacer material 125 also includes the air gaps 135a-135d positioned adjacent to each side of the structure 115a. For example, the air gap 135a is adjacent to the sidewall 151, the air gap 135b is adjacent to the sidewall 152, an air gap 135c is adjacent to a sidewall 253 and an air gap 135d is adjacent to a sidewall 254. In some examples, the air gaps 135a-135d further reduce the dielectric constant (k) insulating materials in the interconnect layer 110 since the k of the air gaps is effectively 1.

As described above, in some examples, the areas in the interconnect layer 110 not occupied by the components of the first array 115, the second array 120, and the spacer material 125 (including air gaps formed in the spacer material) is filled with low-k dielectric material (e.g., OMCTS) to form the material section 130. The formation of the structures in the first array 115, the second array 120, and the spacer materials 125 as well as the deposition of the material section 130 utilizes various fabrication techniques including litho-etch-litho-etch (LELE) processes as described in relation to FIGS. 3-5I.

As will be appreciated, because some of the Figures herein depict in-process fabrication of the device 101 and the interconnect layer 110, the interconnect layers and various structures in the first array 115 and the second array 120, depicted in FIG. 1A, may include temporary elements that are not included in the final interconnect layer 110 or have shapes and size of elements that differ from those in the final interconnect layer 110. Similarly, various elements may be absent at various stages of fabrication, and are therefore absent in view that would otherwise include those elements in the given interconnect layer 110 at a later time during fabrication. Additionally, although shown with various sizes, shapes, and quantities of components in the Figures, the elements are provided as non-limiting examples to illustrate potential embodiments of the interconnect layer 110, which may include different sizes, shapes, and quantities of components from those illustrated in the Figures. Furthermore, various elements may be intentionally omitted or resized to better show certain relationships between the other elements.

Figure 3:
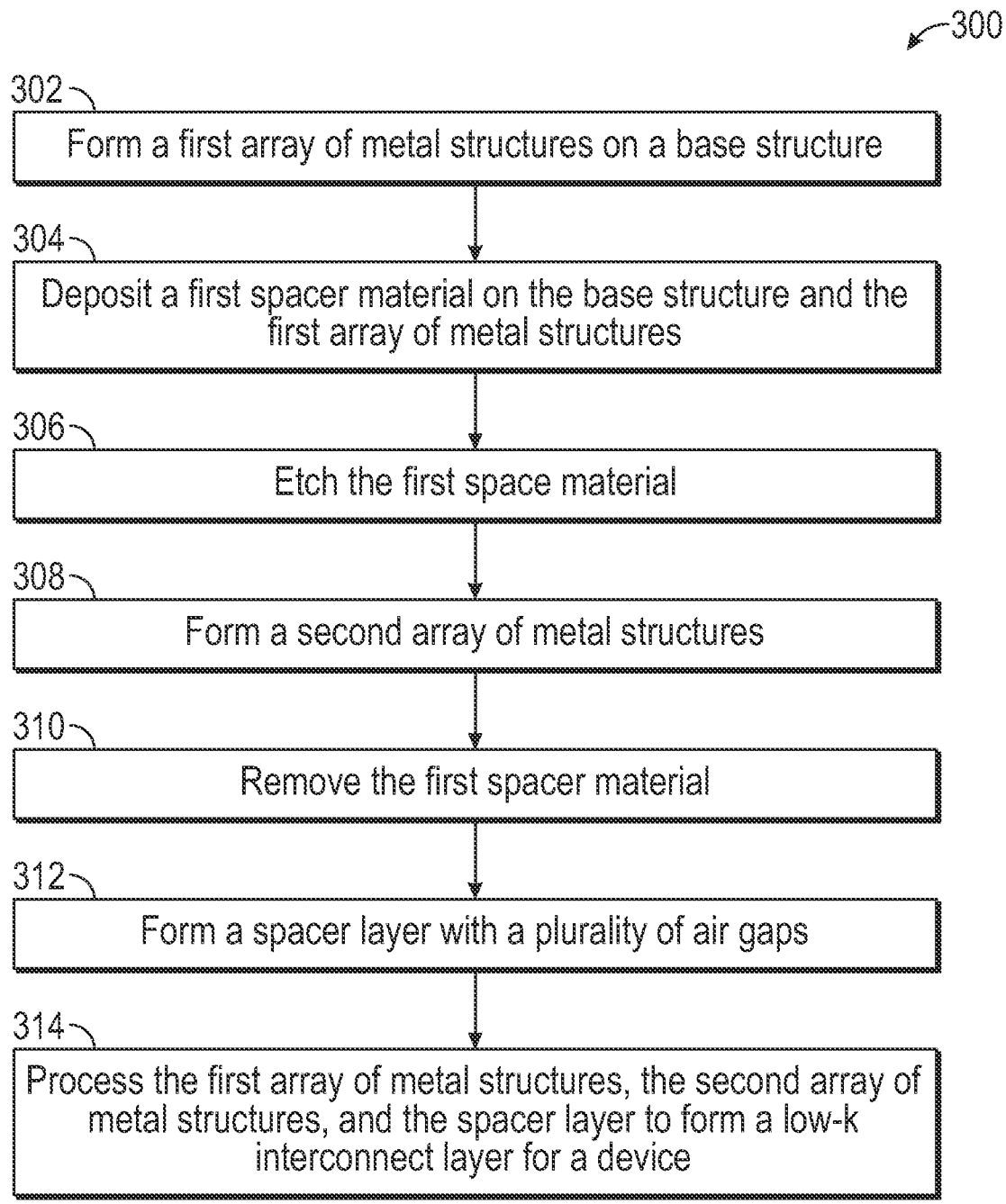
FIG. 3 is a flowchart of a method for fabrication of a low-k interconnect layer, according to embodiments of the present disclosure.

FIG. 3 is a flowchart of a method 300 for fabrication of an interconnect layer, according to embodiments of the present disclosure. Method 300 may be understood in conjunction with FIGS. 4A-K, which illustrate a cross-section of the structure during fabrication, and FIGS. 5A-I, which illustrate a top-side view of the structure during fabrication, according to embodiments of the present disclosure. The methods described in FIGS. 3 5I are described in terms of an LELE process, but may be understood to utilize any type of similar double-patterning technique to form a low-k interconnect layer such as the interconnect layer 110 or an interconnect layer 480 as described herein.

Method 300 begins at block 302, where a fabricator forms a first array of metal structures on a base structure. For example, as shown in FIGS. 4A-B and 5A-C, the fabricator forms the first array on a base structure 400. In some examples, the base structure 400 includes lower layers, such as lower layers 102 described in relation to FIG. 1A. The base structure 400 may include a substrate 401, ILD layer 402, and a first etch stop layer 403 (base etch stop layer in contact with an interconnect layer). The base structure may also include metal contacts 408 formed in the layers of the base structure 400, where the metal contacts are in contact with a top surface of the base structure 400 to provide connectivity to an interconnect layer formed in the method 300.

Figure 4A:
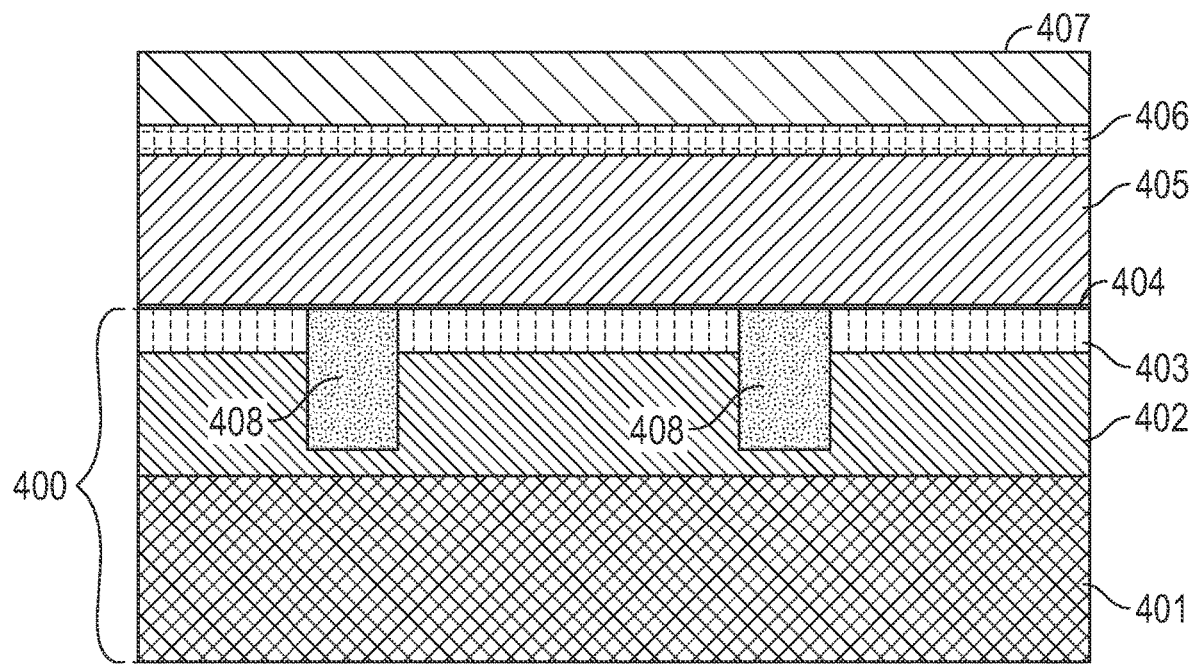
FIGS. 4A-K and 5A-I illustrate several views of an interconnect layer during fabrication, according to embodiments of the present disclosure.

In some examples, forming the first array includes forming/depositing a first liner layer, liner layer 404, on the base structure 400 as shown in FIG. 4A. The liner layer 404 may include any type of suitable material to provide a liner or barrier layer in the interconnect layer. For example, the liner layer 404 may include any of Titanium nitride (TiN), Tantalum nitride (TaN), etc. The fabricator also forms/deposits a first metal layer 405 on the first liner layer, forms/deposits a mask layer 406 on the first metal layer 405, and a Low Temperature Oxide (LTO) layer, LTO layer 407, on the mask layer 406. In some examples, the first metal layer 405 includes cobalt (Co) or other suitable metal material to provide an interconnect structure. The mask layer 406 may include AlNx or other material to provide a hard mask.

Figure 4B:
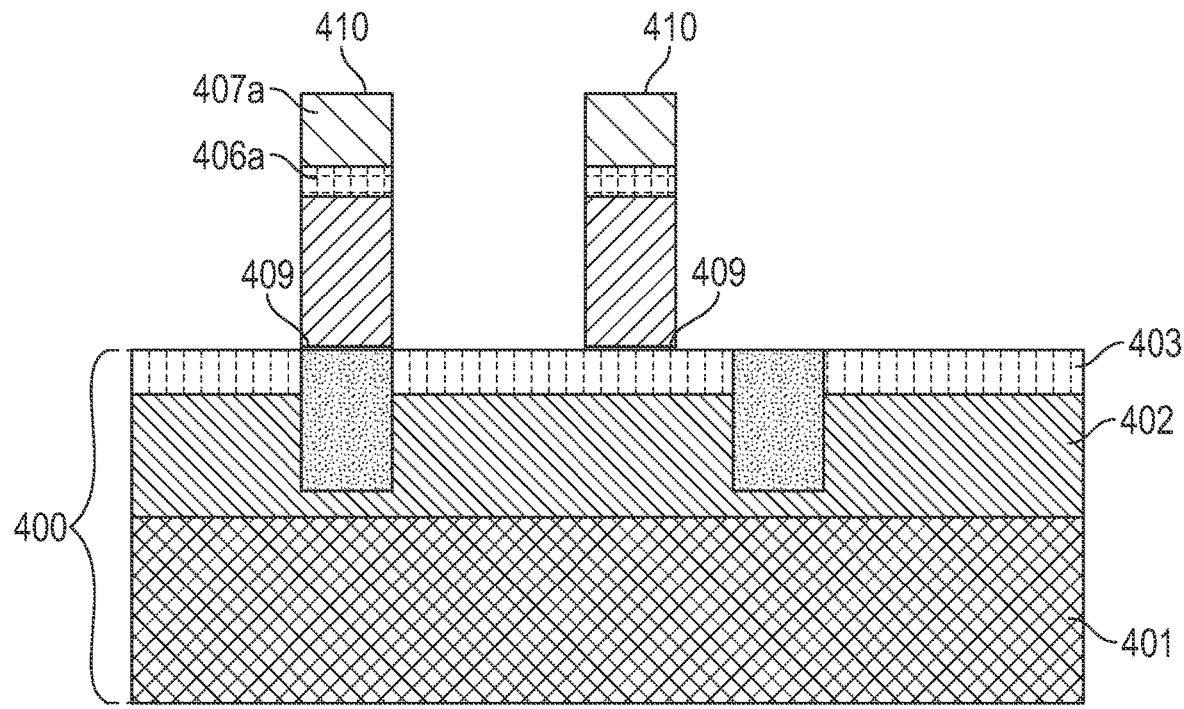
Figure 5A:
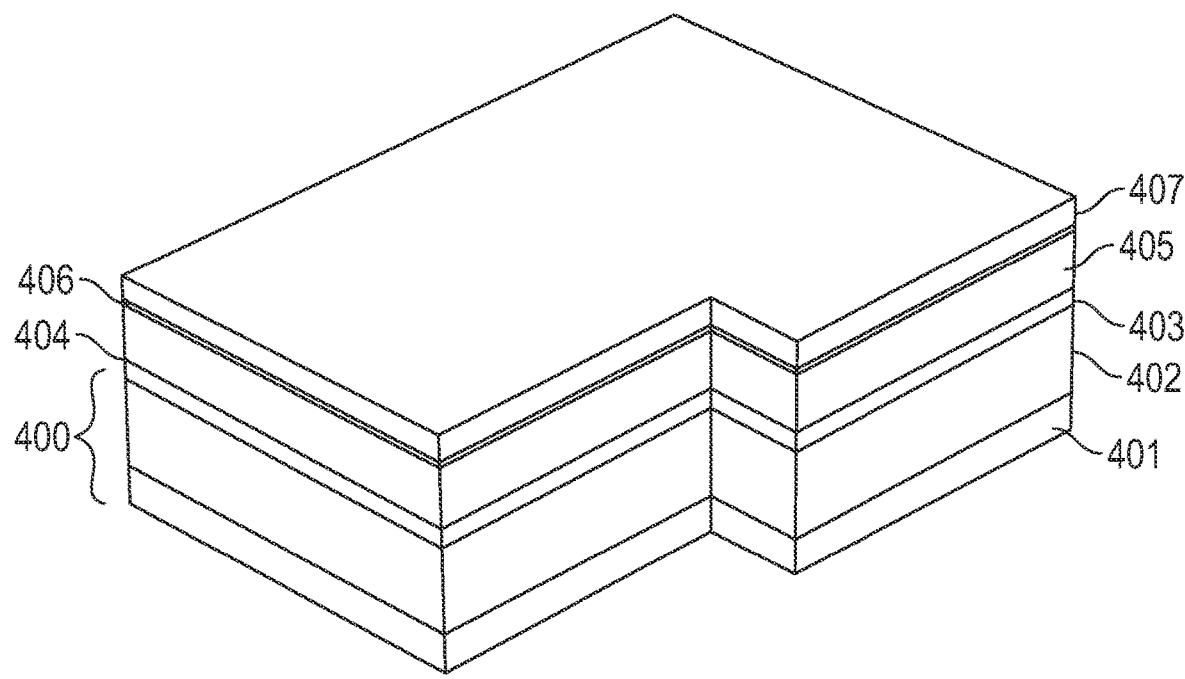
Figure 5B:
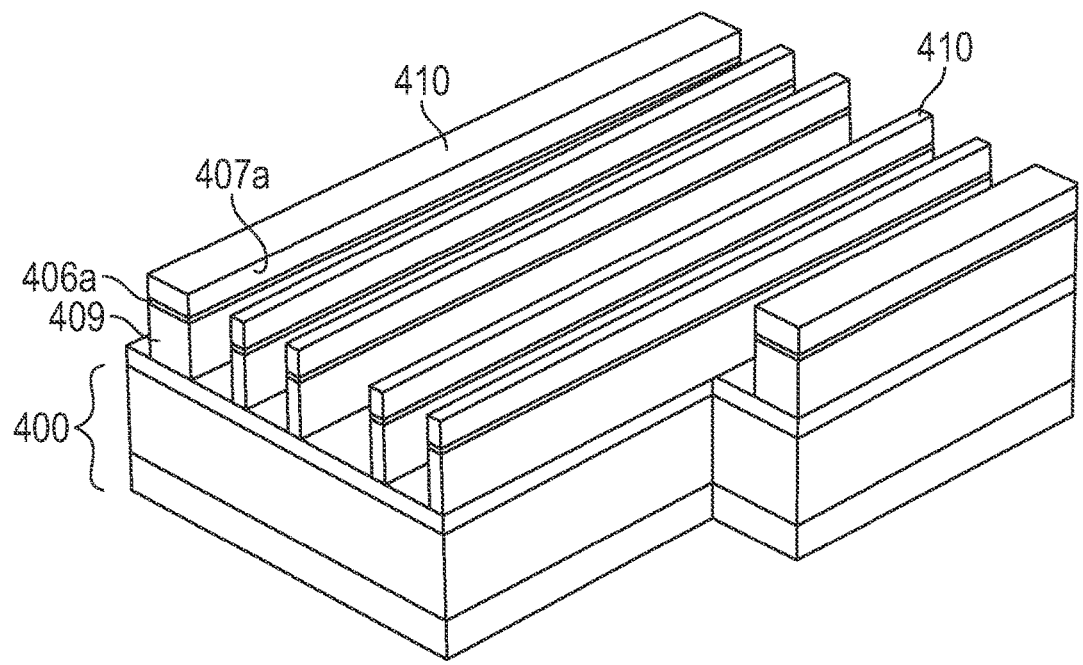
Figure 5C:
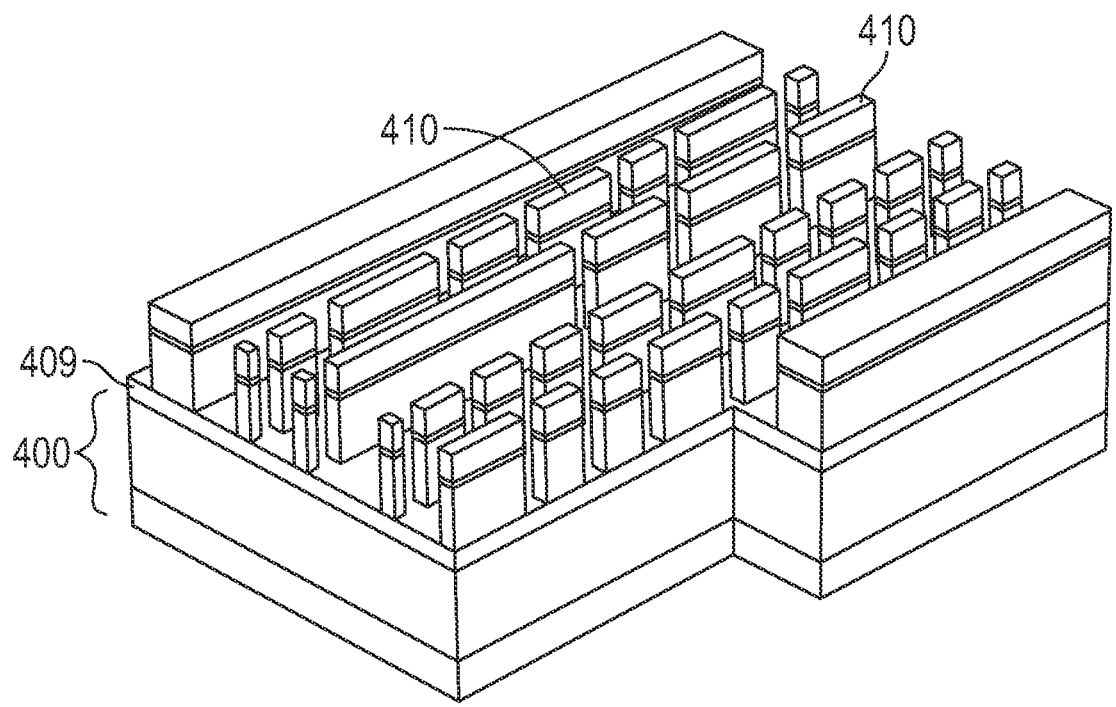

In order to form the first array of metal structures, the fabricator patterns the layers 404-407 into mandrels 410 shown in FIGS. 4B, 5B, and 5C, which form a basis for the first array of metal structures (e.g., the first array 115). The mandrels 410 also includes portions 406a and 407a remaining from the respective layers 406 and 407. The mandrels also include respective liner sections 409 between the respective mandrel 410s and the base structure 400. In some examples, the fabricator uses a litho-etch and/or reactive-ion etching (RIE) or other subtractive metal patterning and cut patterning processes to form/pattern the mandrels 410 from the layers 404-407 (i.e., a first litho-etch process). Once fully processed as described in relation to block 314 below, the mandrels 410 will form the first array of metal structures (e.g., the first array 115 shown in FIG. 1).

Figure 4C:
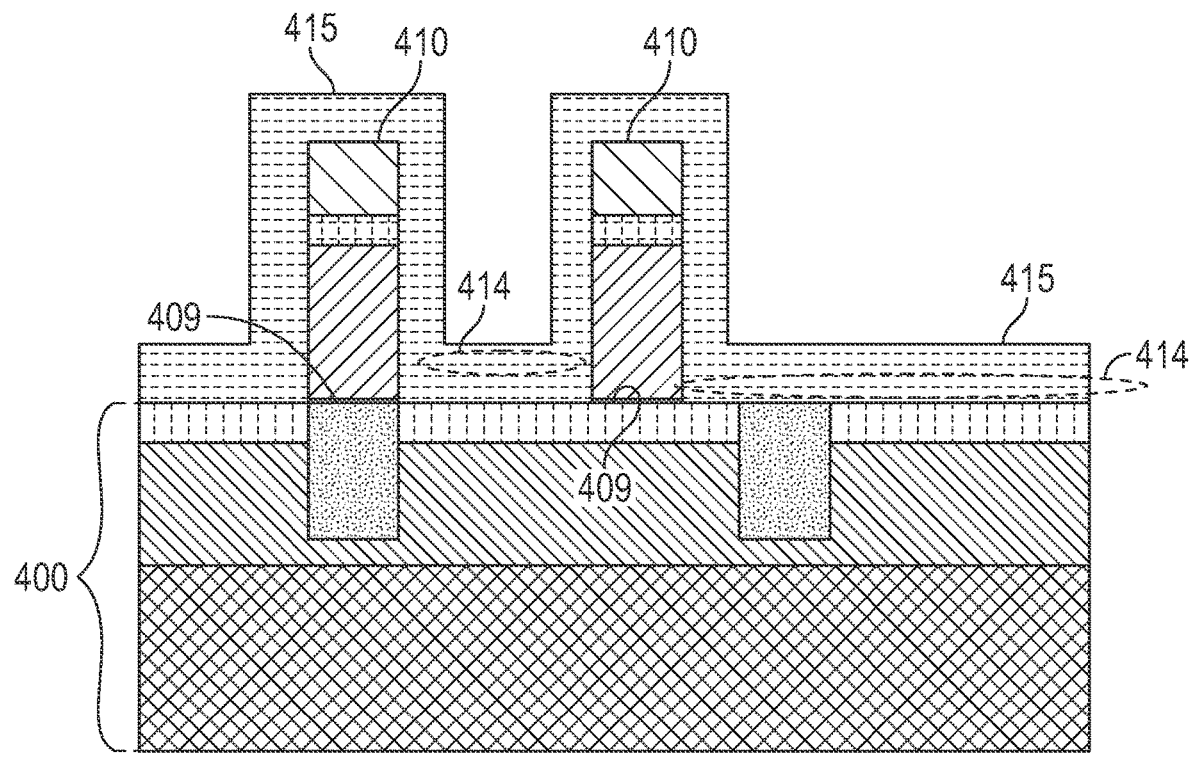

At block 304, the fabricator deposits a first spacer material on the base structure and the first array of metal structures. For example, as shown in FIG. 4C, the fabricator deposits a spacer material 415 over the mandrels 410 as well as over portions 414 over sections of the base structure 400 not covered by the mandrels 410. In some examples, the spacer material 415 includes Silicon Nitride (SiN) applied in an Atomic Layer Deposition (ALD) or other suitable spacer material for use in an interconnect layer.

Figure 4D:
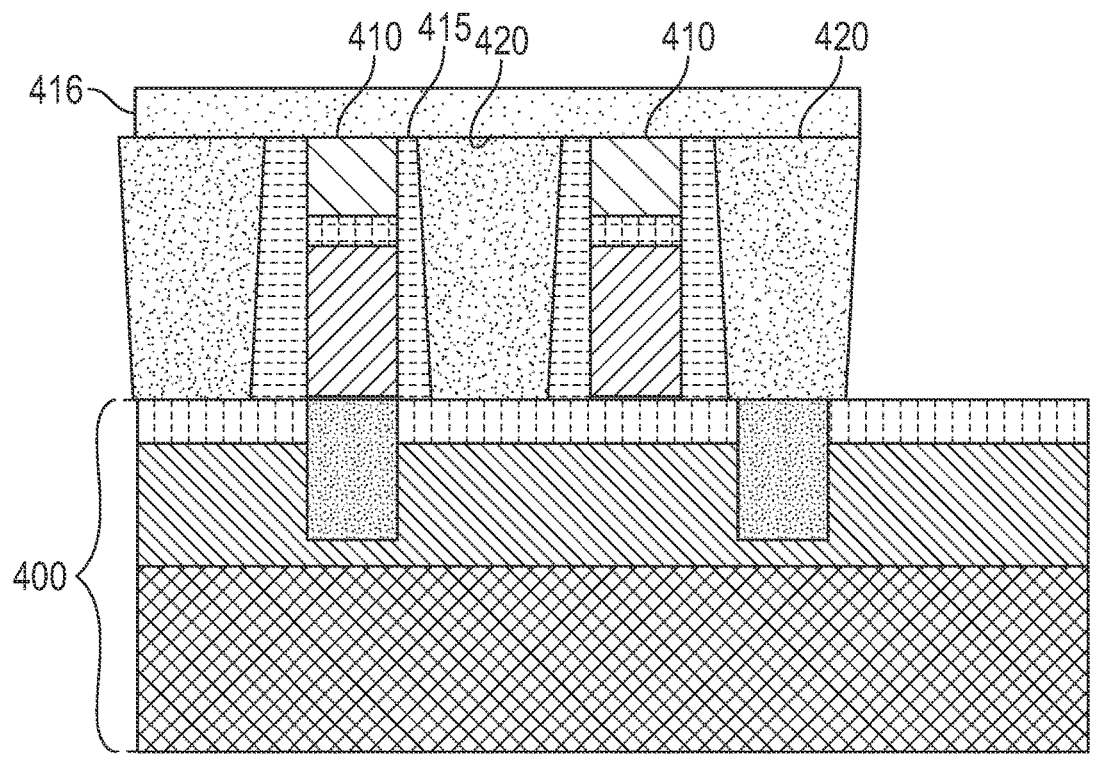
Figure 5D:
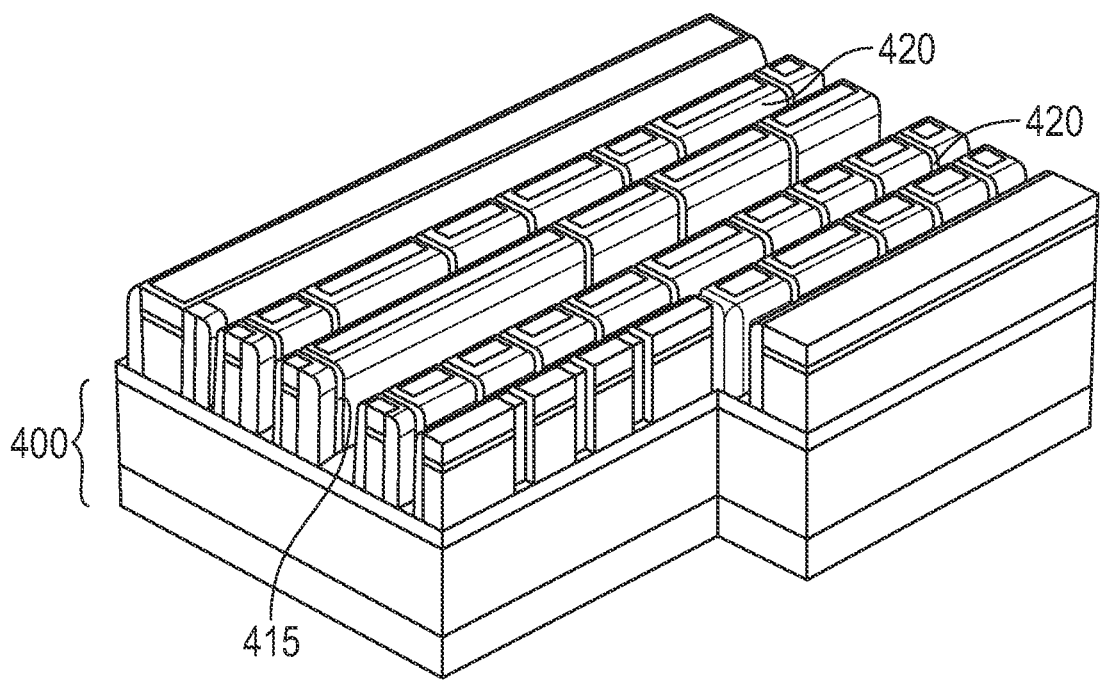
Figure 5E:
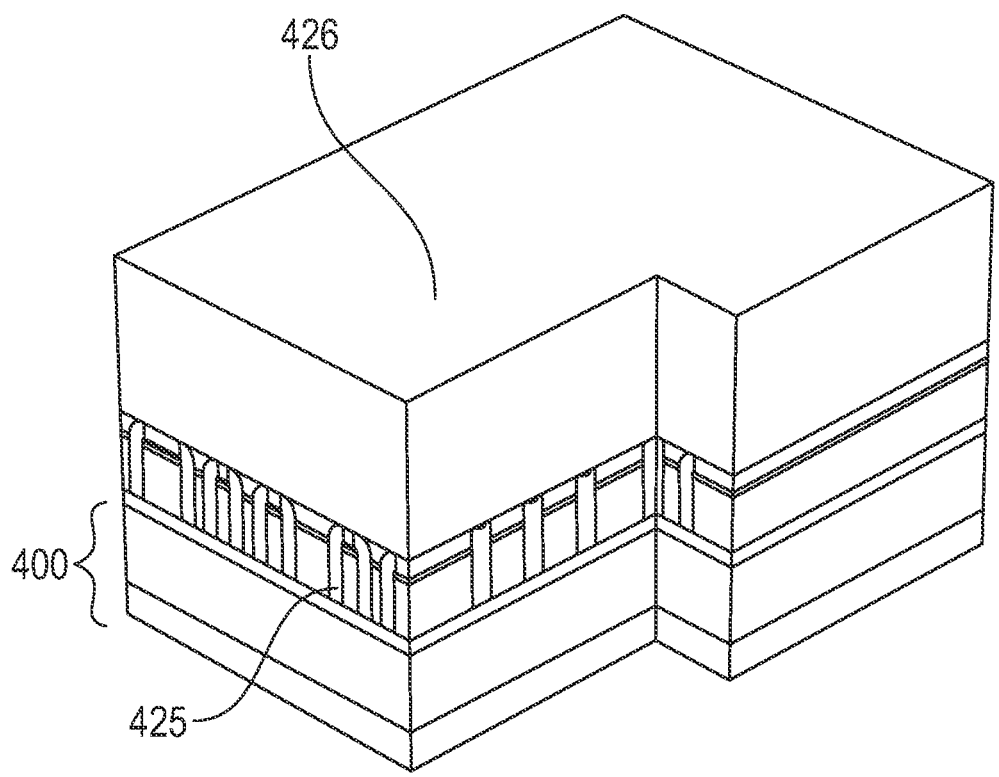

At block 306, the fabricator etches the first space material to form an array of structured spaces in the spacer material. For example, as shown in FIGS. 4D and 5D, the fabricator, using spacer RIE processes, forms an array 420 of structured spaces (voids) in the spacer material 415. In some examples, the structured spaces in array 420 have a trapezoidal cross-sectional area similar to the cross-sectional areas described above in relation to FIG. 1C. The fabricator may also remove portion 416 of the spacer material 415 above the mandrels 410. In some examples, the remaining spacer material 415 around the structured spaces in the array 420 provides a mold for formation of additional interconnections, such as the second array 120 described in FIG. 1A.

Figure 4E:
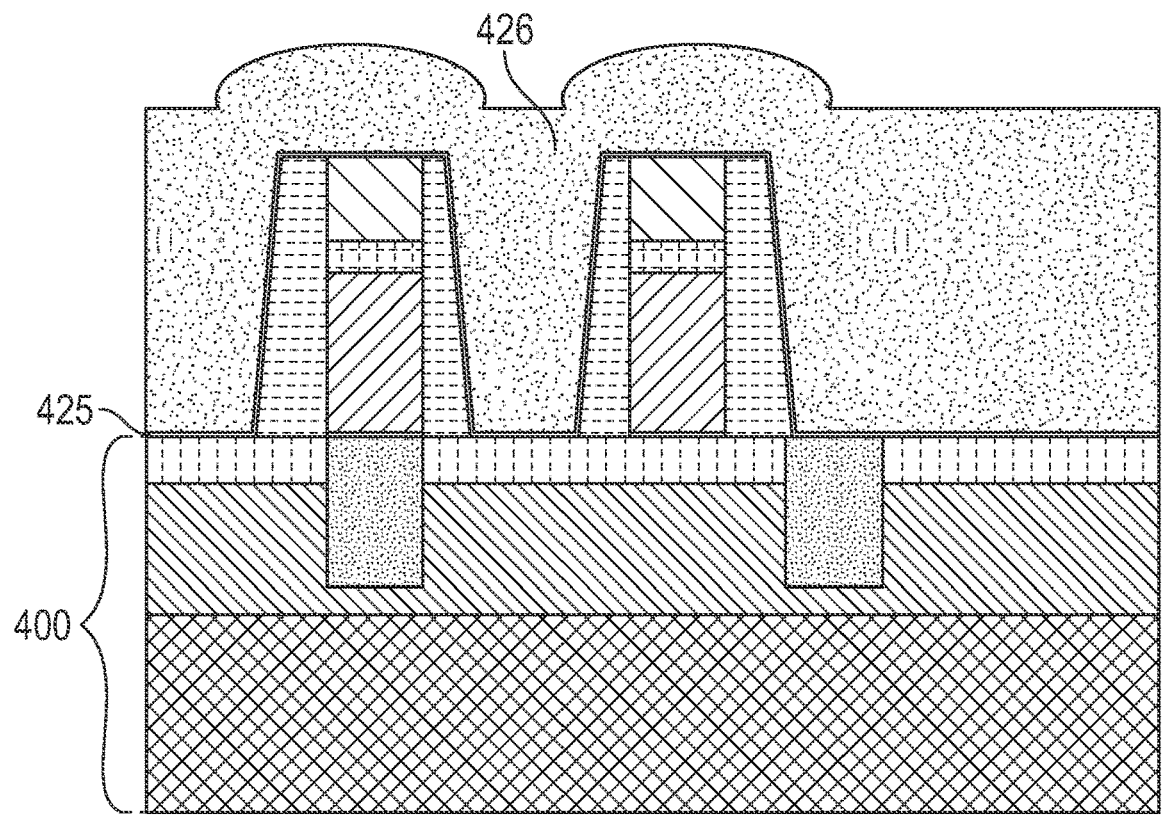

At block 308, the fabricator forms a second array of metal structures using the array of structured spaces. In some examples, the fabricator performs several processes including a second litho-etch process to form the second array as shown in FIGS. 4E-4G and FIGS. 5E-5F. For example as shown in FIGS. 4E and 5E, the fabricator deposits a second liner layer 425 within at least the array of structured spaces, array 420 shown in FIG. 4D. The second liner layer 425 is formed with TiN, TaN, or other suitable material. The fabricator also deposits a second metal material layer, metal layer 426, over the second liner layer 425 and within the array 420. The metal layer 426 may include Co, Ruthenium (Ru), W, or other suitable metal material. In some examples, the metal layer 426 is a different metal than the first metal material (e.g., the metal material in the mandrels 410).

Figure 4F:
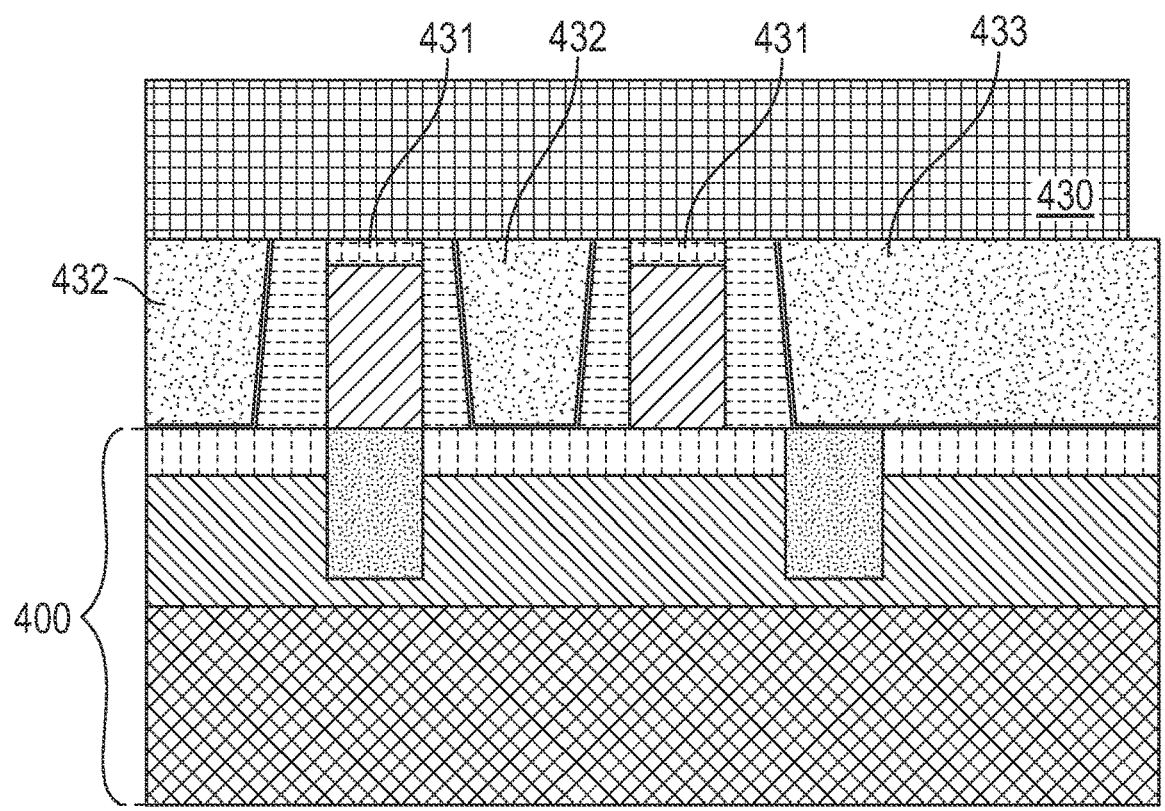
Figure 4G:
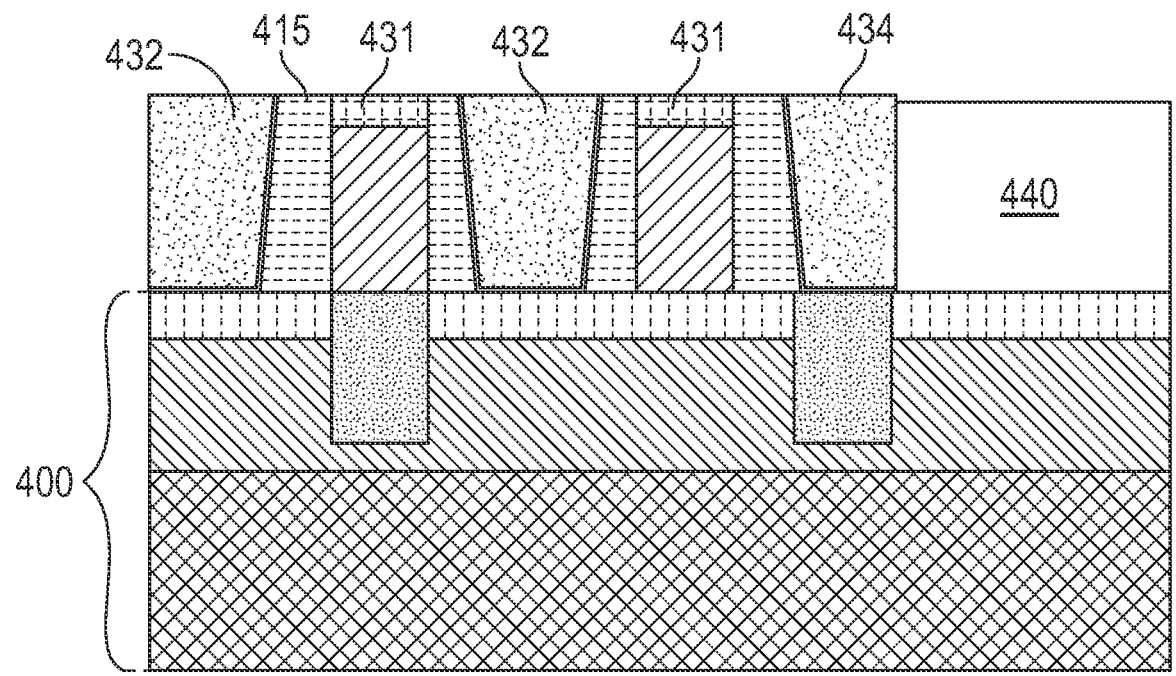
Figure 5F:
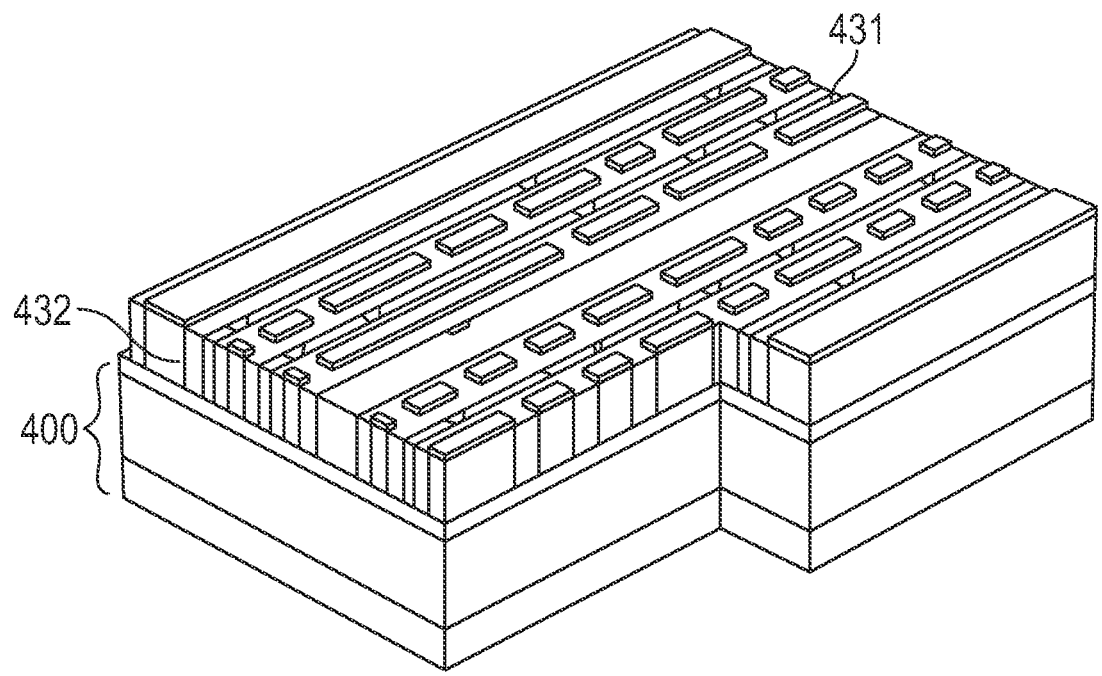

In some examples, the fabricator also removes a portion 430 of the deposited second metal material to form the second array of metal structures as shown in FIGS. 4F-G and 5F. In some examples, the fabricator uses polishing processes, such as Co CMP, to remove portion 430 of the layer 426 as shown in FIG. 4F. In some examples, structures 432 have a trapezoidal cross-section and are positioned between mandrels 431, where mandrels 431 are formed when the remains of layers 407a are removed from the mandrels 410 in the polishing process. In some examples, the structure 433 is further processed by the fabricator using a litho-etch RIE process as shown in FIG. 4G, to form the structure 434, where the structures 432 and 434 make up the second array of metal structures (i.e., a second litho-etch process). In some examples, the litho-etch process removes the portion 430 from the metal layer 426.

Figure 4H:
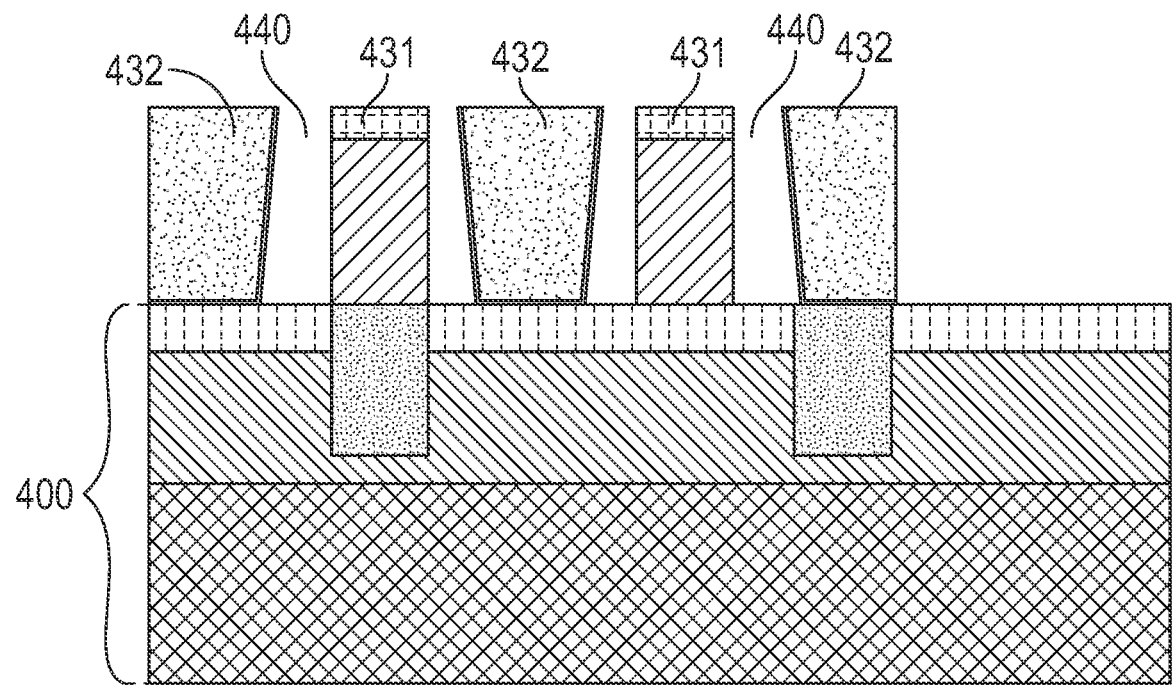
Figure 5G:
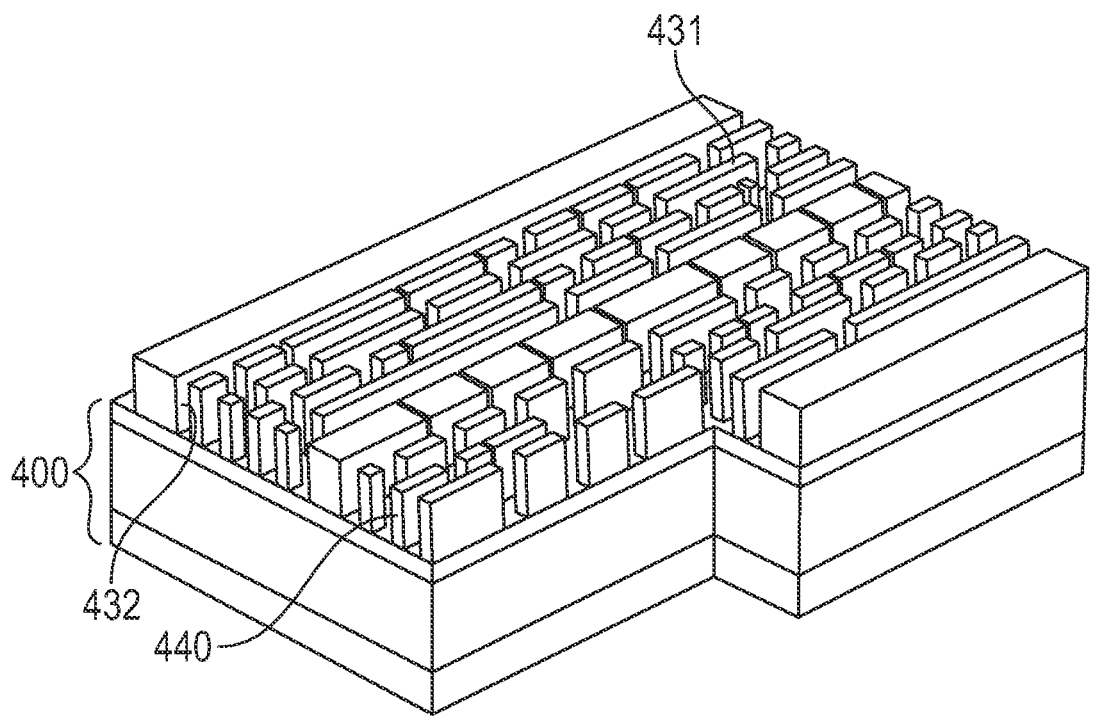

At block 310, the fabricator removes the first spacer material. For example, as shown in FIGS. 4H and 5G, the fabricator uses a wet etching process to remove the remains of the spacer material 415 from the spaces 440. In some examples, as shown in FIG. 4H, the remaining structures include the mandrels 431 and the structure 432 and 434.

Figure 4I:
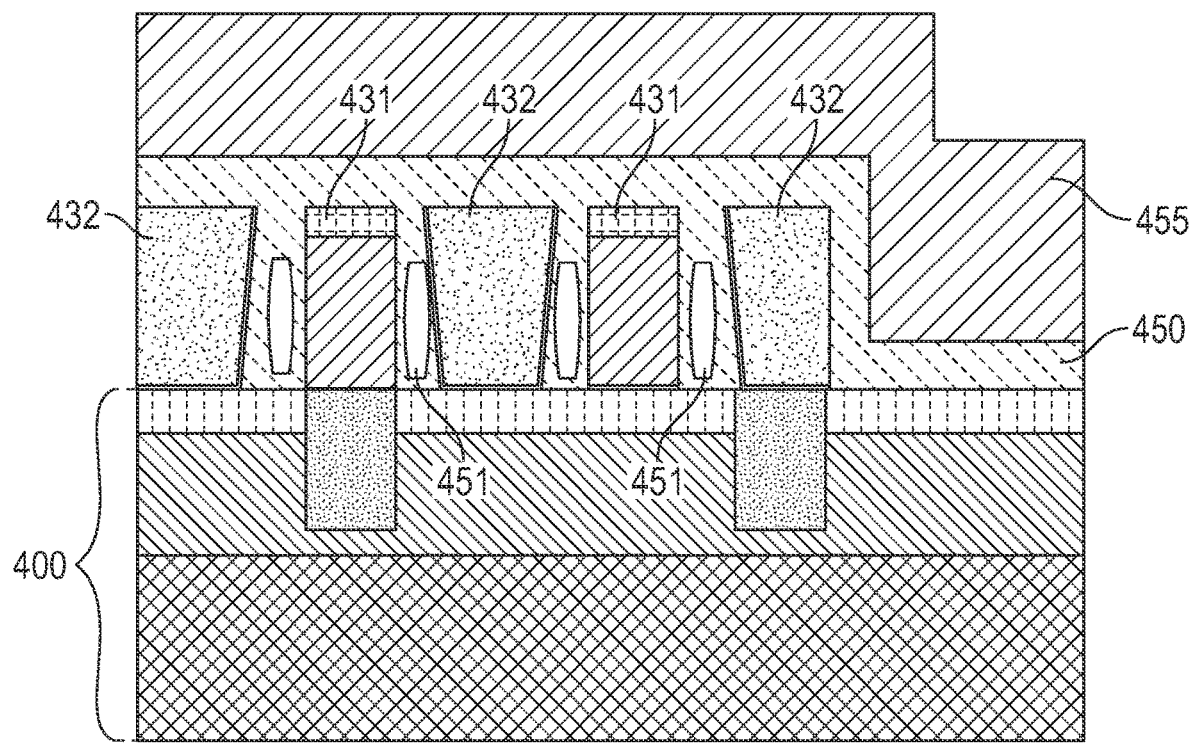

At block 312, the fabricator forms a spacer layer with a plurality of air gaps between the first array of metal structures and the second array of metal structures. For example, as shown in FIG. 4I, the fabricator deposits/forms the layer 450, where the layer 450 includes air gaps 451. In some examples, the fabricator utilizes cyclic SiN deposition and pinch-off processes to fill the spaces 440 shown in FIG. 4H and to form the air gaps 451. In some examples, the layer 450 is formed from SiN or other suitable low-k dielectric material which allows for the formation of air gaps.

In some examples, the fabricator also deposits a low-k material layer 455 on at least a portion of the base structure 400 not occupied by the first array of metal structures, the second array of metal structures, and the spacer layer prior to processing the first array of metal structures, the second array of metal structures, and the spacer layer to form the low-k interconnect layer.

Figure 4J:
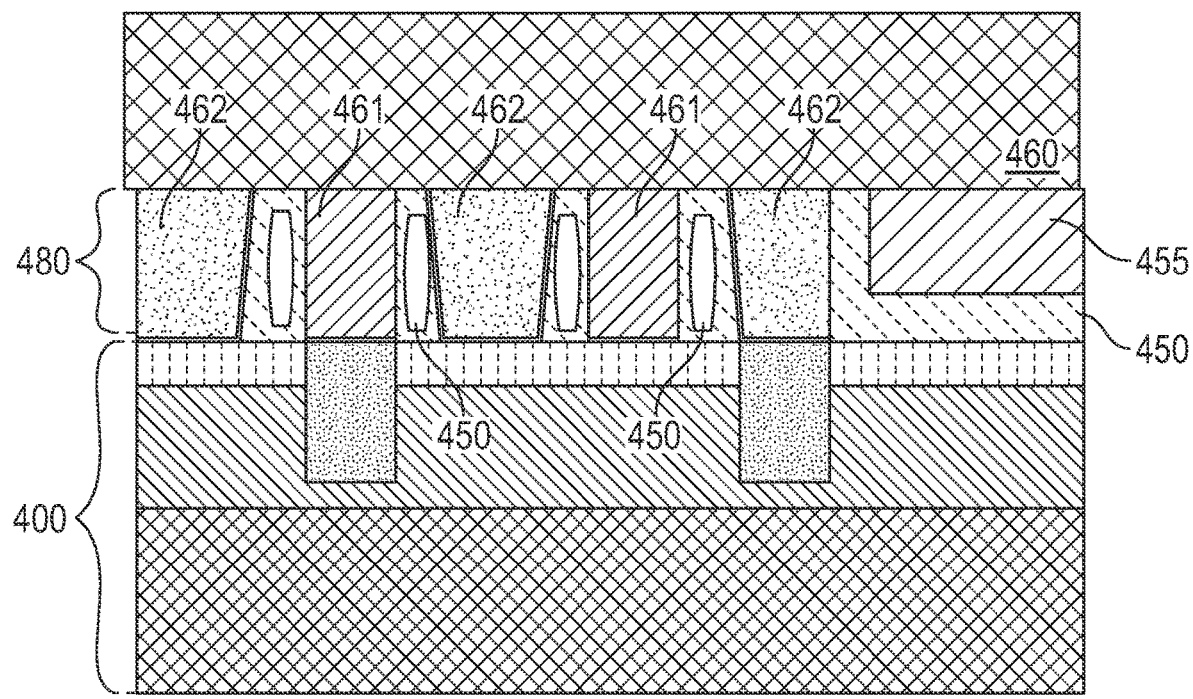
Figure 4K:
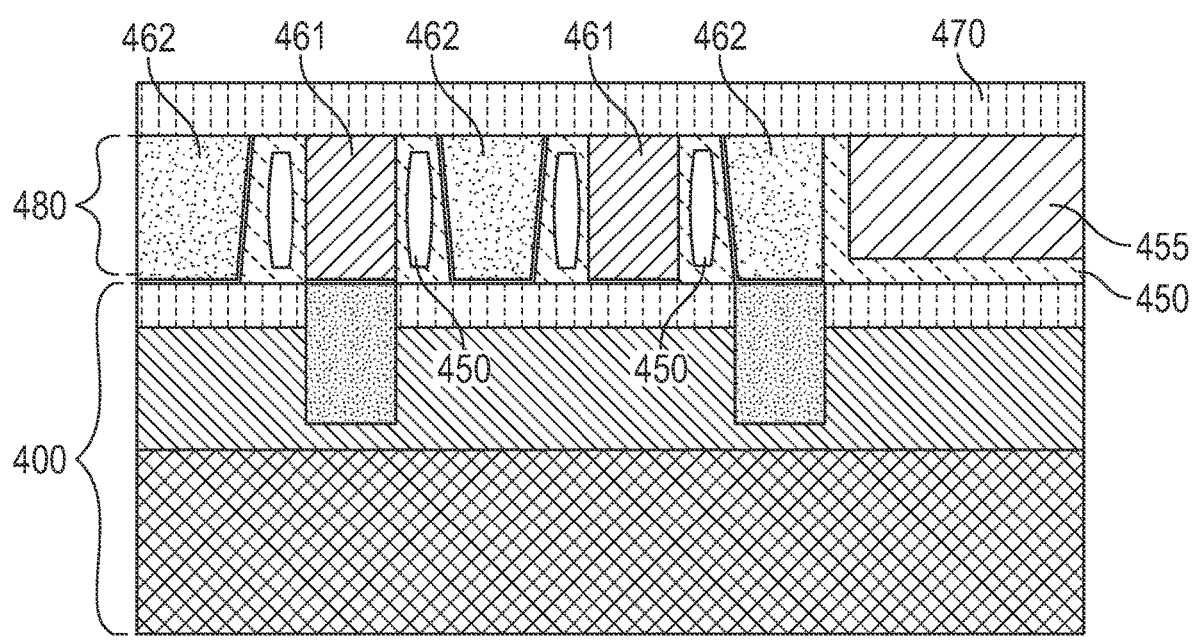
Figure 5H:
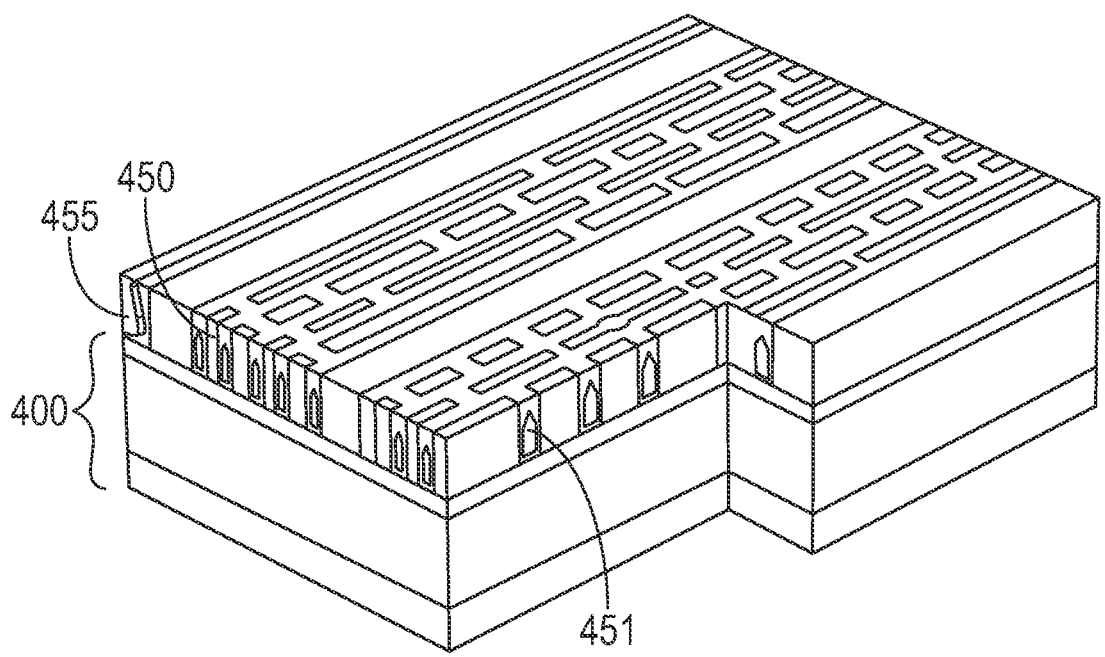
Figure 5I:
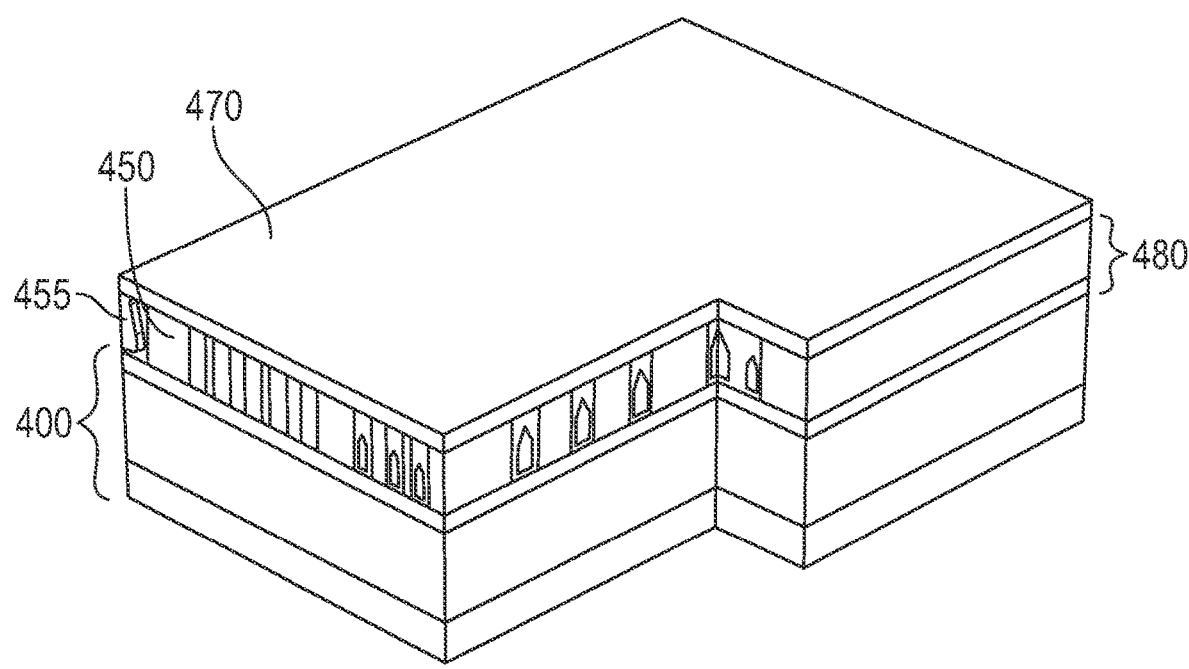

At block 314, the fabricator processes the first array of metal structures, the second array of metal structures, and the spacer layer to form a low-k interconnect layer for a device. For example, as shown in FIGS. 4J and 5H, the fabricator removes portion 460 of the layer 450 and layer 455 as well as the hard mask layer from the mandrels 431 and structures 432 and 434 to form a first array 461 and a second array 462. In some examples, the polished arrays 461, 462, and the polished sections of the layers 450 and 455 form an interconnect layer 480 similar to the interconnect layer 110 described in FIG. 1A. In some examples, the fabricator also further processes the interconnect layer 480 as shown in FIGS. 4K and 5I, where a second etch stop layer 470 is formed on the interconnect layer 480. In some examples, the layer 470 is an interconnect etch stop cap layer.

As described above in relation to FIGS. 1A-D and FIG. 2, the interconnect layer 110 and the interconnect layer 480 provide very low-k dielectric insulation between the interconnects of the interconnection layers allows for denser and complicated interconnection patterns to be utilized in the interconnection layers.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages discussed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

What is claimed is:

1. An interconnect layer for a device comprising:
a plurality of first metal structures arranged in a first array in the interconnect layer, wherein the plurality of first metal structures extend between a first plane and a second plane of the interconnect layer;
a plurality of second metal structures, arranged in a second array in the interconnect layer, wherein the second array comprises at least one metal structure of the plurality of second metal structures positioned between two metal structures of the plurality of first metal structures, wherein:
the plurality of second metal structures extend between the first plane and the second plane of the interconnect layer, and
the plurality of second metal structures comprise a different composition from the plurality of first metal structures,
a spacer material formed around each of the plurality of first metal structures and the plurality of second metal structures; and
a plurality of air gaps formed in the spacer material on each side of the plurality of first metal structures.

2. The interconnect layer of claim 1, wherein the spacer material comprises an interlayer dielectric (ILD) material.

3. The interconnect layer of claim 1, further comprising one or more of:
a first liner formed on a bottom side of a respective metal structure of the plurality of first metal structures or of the plurality of second metal structures;
a second liner formed on a first sidewall of the respective metal structure; and
a third liner formed on a second sidewall of the respective metal structure.

4. The interconnect layer of claim 1, further comprising a section of dielectric material filling a space in the interconnect layer not occupied by the first array, the second array, and the spacer material.

5. The interconnect layer of claim 1, wherein the plurality of first metal structures comprise a first metal material, wherein the plurality of second metal structures comprise a second metal material, and wherein the first metal material is different than the second metal material.

6. The interconnect layer of claim 1, wherein the plurality of second metal structures comprise a trapezoidal cross-sectional shape, where a bottom side of the trapezoidal cross-sectional shape of the plurality of second metal structures is a first length, wherein a top side of the trapezoidal cross-sectional shape of the plurality of second metal structures is a second length, and wherein the second length is longer than the first length.

7. The interconnect layer of claim 1, wherein the first plane is part of a first etch stop layer on a first side of the interconnect layer and the second plane is part of a second etch stop layer on a second side of the interconnect layer.

8. A device comprising:
a first layer comprising one or more metal contacts; and
an interconnect layer formed on the first layer, comprising:
a plurality of first metal structures arranged in a first array in the interconnect layer, wherein the plurality of first metal structures extend between a first plane and a second plane of the interconnect layer;
a plurality of second metal structures, arranged in a second array in the interconnect layer, wherein the second array comprises at least one metal structure of the plurality of second metal structures positioned between two metal structures of the plurality of first metal structures, wherein:
the plurality of second metal structures extend between the first plane and the second plane of the interconnect layer, and
the plurality of second metal structures comprise a different composition from the plurality of first metal structures,
a spacer material formed around each of the plurality of first metal structures and the plurality of second metal structures; and
a plurality of air gaps formed in the spacer material on each side of the plurality of first metal structures.

9. The device of claim 8, further comprising one or more of:
a first liner formed on a bottom side of a respective metal structure of the plurality of first metal structures or of the plurality of second metal structures;
a second liner formed on a first sidewall of the respective metal structure; and
a third liner formed on a second sidewall of the respective metal structure.

10. The device of claim 8, further comprising a section of low-k dielectric material filling a space in the interconnect layer not occupied by the first array, the second array, and the spacer material.

11. The device of claim 8, wherein the plurality of first metal structures comprise a first metal material, wherein the plurality of second metal structures comprise a second metal material, and wherein the first metal material is different than the second metal material.

12. The device of claim 8, wherein the plurality of second metal structures comprise a trapezoidal cross-sectional shape, where a bottom side of the trapezoidal cross-sectional shape of the plurality of second metal structures is a first length, wherein a top side of the trapezoidal cross-sectional shape of the plurality of second metal structures is a second length, and wherein the second length is longer than the first length.

13. The device of claim 8, wherein the first plane is part of a first etch stop layer on a first side of the interconnect layer and the second plane is part of a second etch stop layer on a second side of the interconnect layer.

14. A method comprising:
forming a first array of metal structures on a base structure;
depositing a first spacer material on the base structure and the first array of metal structures;
etching the first spacer material to form an array of structured spaces in the first spacer material;
forming a second array of metal structures using the array of structured spaces;
removing the first spacer material;
forming a spacer layer with a plurality of air gaps between the first array of metal structures and the second array of metal structures; and
processing the first array of metal structures, the second array of metal structures, and the spacer layer to form an interconnect layer for a device.

15. The method of claim 14, wherein forming the first array of metal structures on the base structure comprises:
forming a first liner layer on the base structure;
forming a first metal layer on the first liner layer;
forming a first mask layer on the first metal layer;
forming an low temperature oxide (LTO) layer on the first metal layer; and
etching the first liner layer, the first metal layer, the first mask layer, and the LTO layer to form the first array of metal structures.

16. The method of claim 14, wherein forming the second array of metal structures comprises:
depositing a second liner layer within at least the array of structured spaces;
depositing a second metal material within at least the array of structured spaces; and removing a portion of the deposited second metal material to form the second array of metal structures.

17. The method of claim 14, further comprising:
depositing a low-k material on a portion of the base structure not occupied by the first array of metal structures, the second array of metal structures, and the spacer layer prior to processing the first array of metal structures, the second array of metal structures, and the spacer layer to form the interconnect layer.

18. The method of claim 14, wherein the base structure comprises:
one or more metal contacts in contact with the interconnect layer; and
a base etch stop layer in contact with the interconnect layer; and
wherein the method further comprises:
depositing an interconnect etch stop cap layer on the first array of metal structures, the second array of metal structures, and the spacer layer.

19. The method of claim 14, wherein forming the first array of metal structures comprises a first litho-etch process, and wherein forming the second array of metal structures comprises a second litho-etch process.

20. The method of claim 14, wherein the first array of metal structures comprise a first metal material, wherein the second array of metal structures comprise a second metal material, and wherein the first metal material is different than the second metal material.

* * * * *